United States Patent
Kim, II

(10) Patent No.: US 6,969,897 B2
(45) Date of Patent: Nov. 29, 2005

(54) OPTOELECTRONIC DEVICES EMPLOYING FIBERS FOR LIGHT COLLECTION AND EMISSION

(76) Inventor: John Kim, II, 11443 Maple Valley, Plymouth, MI (US) 48170

(*) Notice: Subject to any disclaimer, the term of this patent is extended or adjusted under 35 U.S.C. 154(b) by 85 days.

(21) Appl. No.: 10/315,723

(22) Filed: Dec. 10, 2002

(65) Prior Publication Data

US 2004/0109666 A1 Jun. 10, 2004

(51) Int. Cl.$^7$ ............... H01L 31/0232; H01L 31/0203
(52) U.S. Cl. ............... 257/432; 257/40; 257/99; 257/433; 438/22; 438/25; 438/48; 438/64
(58) Field of Search ............... 257/40, 99, 432, 257/433; 438/22, 25, 48, 64

(56) References Cited

U.S. PATENT DOCUMENTS

| | | | |
|---|---|---|---|
| 3,780,722 A | 12/1973 | Swet | 126/270 |
| 4,117,829 A | 10/1978 | Gross et al. | 126/270 |
| 4,252,865 A | 2/1981 | Gilbert et al. | 428/611 |
| 4,322,571 A * | 3/1982 | Stanbery | 136/255 |
| 4,353,788 A | 10/1982 | Jeffrey et al. | 204/192 |
| 4,409,423 A | 10/1983 | Holt | 136/255 |
| 4,478,209 A | 10/1984 | Guarnieri | 126/417 |
| 4,555,622 A | 11/1985 | Glass et al. | 250/211 J |
| 4,644,934 A | 2/1987 | Kaus | 126/435 |
| 4,663,188 A | 5/1987 | Kane | 427/74 |
| 4,812,352 A | 3/1989 | Debe | 428/142 |
| 4,931,412 A | 6/1990 | Fischer et al. | 437/225 |
| 5,039,561 A | 8/1991 | Debe | 427/255.6 |
| 5,081,049 A | 1/1992 | Green et al. | 437/2 |
| 5,575,860 A | 11/1996 | Cherney | 136/245 |
| 5,816,238 A * | 10/1998 | Burns et al. | 126/569 |
| 6,224,016 B1 | 5/2001 | Lee et al. | 244/30 |
| 6,272,269 B1 | 8/2001 | Naum | 385/43 |
| 6,730,840 B2 * | 5/2004 | Sasaoka et al. | 136/246 |
| 2004/0084080 A1 | 5/2004 | Sager et al. | 136/263 |

* cited by examiner

*Primary Examiner*—Donghee Kang
(74) *Attorney, Agent, or Firm*—Gifford, Krass, Groh, Sprinkle, Anderson & Citkowski, PC

(57) ABSTRACT

An optoelectronic device, such as a solar cell, light-emitting device, or photodetector, comprises a substrate, a number of fibers supported by the substrate so that an end of each fiber is in electrical communication with the substrate surface; an optional first layer, covering the substrate, though which the fibers protrude, and a second layer overlaid on at least part of the first layer and exposed fiber surfaces. The second layer may be electrically conducting, and electrically isolated from the substrate surface by the first layer. The second layer can be in electrical communication with each fiber, and an electrically conducting path can exists between the second layer and the substrate surface through each fiber. The substrate, in whole or in part (such as the substrate surface) can be electrically conducting. The electrically conducting path may comprises a semiconductor p-n junction, so that the optoelectronic device emits light, provides a photovoltaic potential, and/or is sensitive to light, for example acting as a photoresistor, photodetector, and the like.

24 Claims, 3 Drawing Sheets

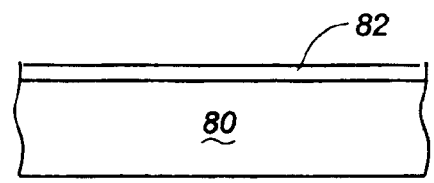
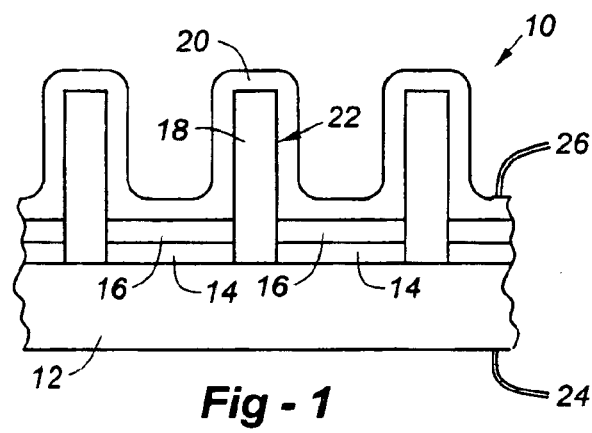
Fig - 3A
Fig - 1
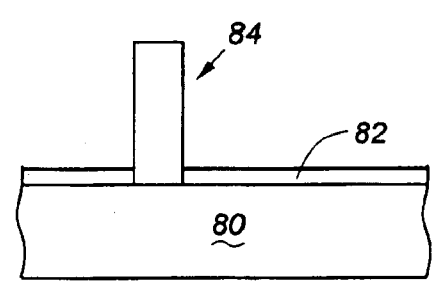
Fig - 3B
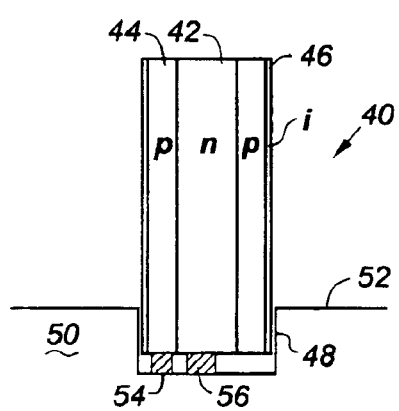
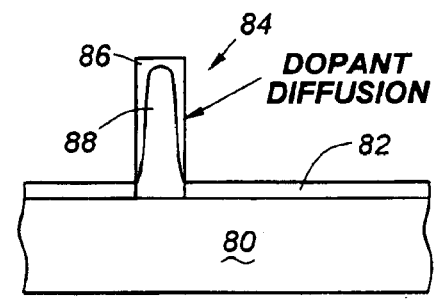
Fig - 2A
Fig - 3C
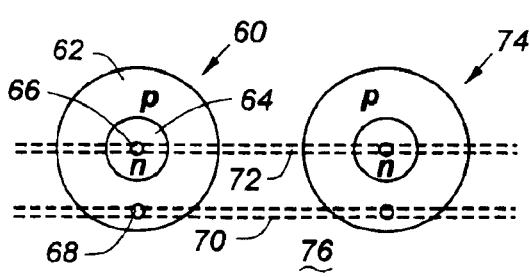
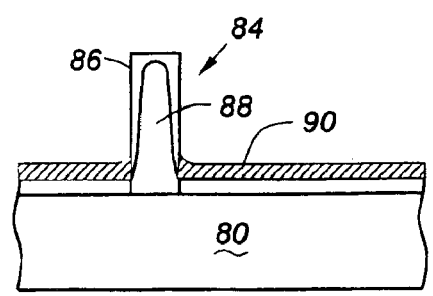
Fig - 2B
Fig - 3D

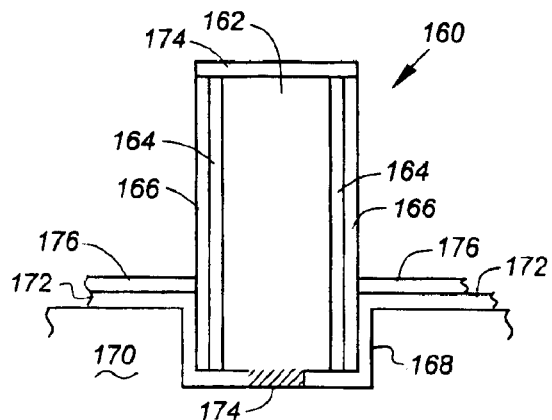
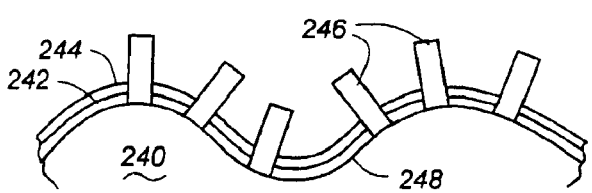
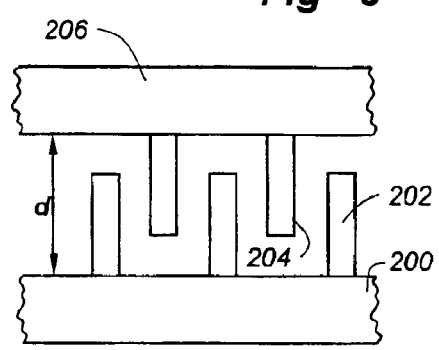
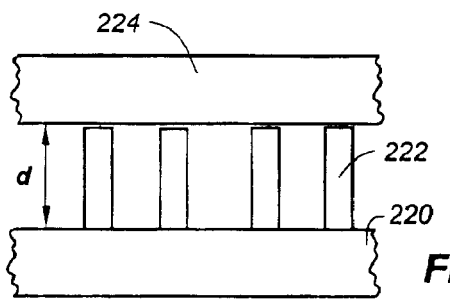
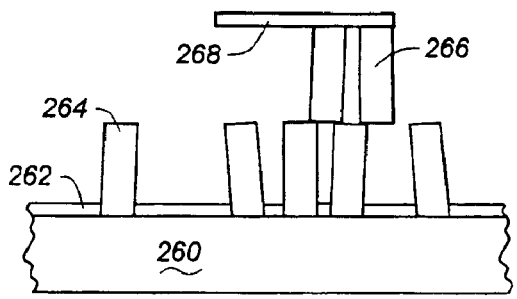
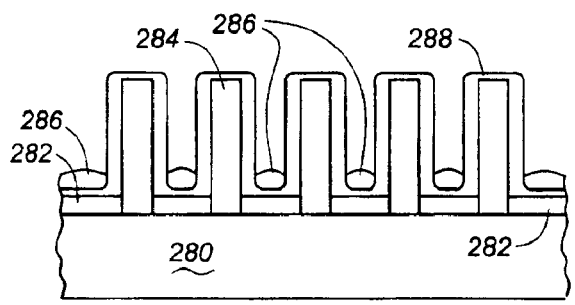
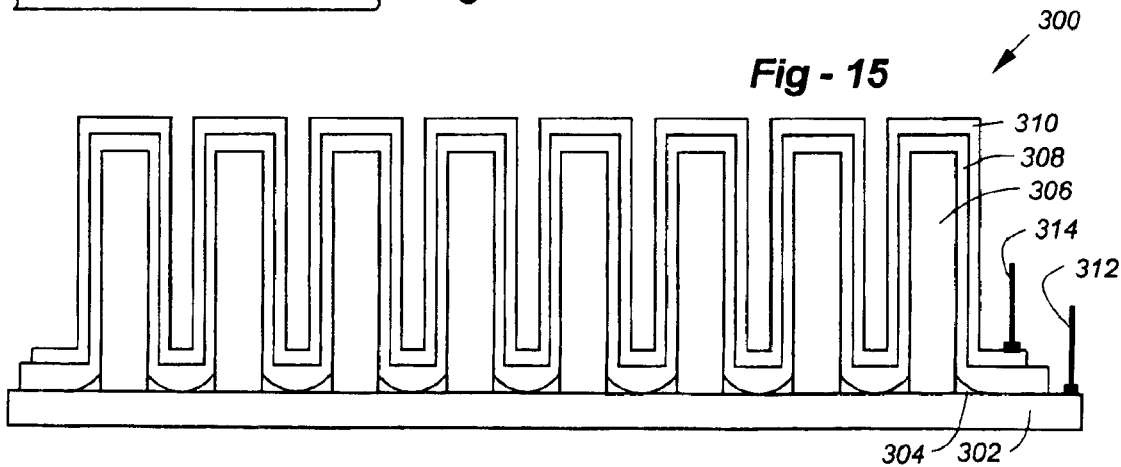

OPTOELECTRONIC DEVICES EMPLOYING FIBERS FOR LIGHT COLLECTION AND EMISSION

FIELD OF THE INVENTION

The invention relates to improved solar collectors and other devices using one or more substrates supporting a plurality of fibers applied using flocking techniques.

BACKGROUND OF THE INVENTION

The goal of solar energy as an inexpensive, alternative energy source has been a dream for many years, and on occasion that dream seems elusive. Various techniques have been attempted and patented to increase efficiency, including multi-bandgap, tandem and compound cells. Experiments have also been tried with respect to physical structures, including concentrators and non-planar collection surfaces.

A search of the prior art was undertaken, and the following references were identified, all of which are incorporated herein by reference:

U.S. Pat. No. 3,780,722 to Swet describes a fiber optical solar receiver, comprising a boule of fibers shaped into an actuate collecting surface at one end.

U.S. Pat. No. 4,117,829 to Gross et al. discloses a heat-absorbing surface having a multiplicity of substantially parallel fibers secured to the surface.

U.S. Pat. No. 4,252,865 to Gilbert et al. discloses a highly solar-energy absorbing device wherein the surface exposed to incident solar energy is an amorphous semiconductor material having particularly characterized roughness.

U.S. Pat. No. 4,322,571 to Stanbery discloses solar cells with inter-electrode photoactive regions preferably being texturized, thereby optimizing current generation per unit of incident radiation and minimizing reflection losses.

U.S. Pat. No. 4,353,788 to Jeffrey et al. discloses a method of preparing amorphous silicon monohydride using sputtering.

U.S. Pat. No. 4,409,423 to Holt discloses a solar cell which comprises a thin silicon chip having on one surface a plurality of holes, closely spaced in a desired array, the walls of the holes defining the vertical junction of the cell.

U.S. Pat. No. 4,478,209 to Guarnieri discloses a radiant energy collector having a substrate coated with polyimide which has been surface-textured to impart the coated substrate with high absorption and low emissivity for radiant energy.

U.S. Pat. No. 4,555,622 to Glass et al. discloses a photodetector having a substantially periodic surface.

U.S. Pat. No. 4,663,188 to Kane discloses a photoconductor including a light transmissive electrically conducting layer having a textured surface with a semiconductor body thereon.

U.S. Pat. No. 4,812,352 to Debe discloses a substrate bearing on at least one major surface thereof a microlayer comprising an array of discrete, single- or polycrystalline, uniformly oriented (with respect to the substrate surface) microstructures of a solid, organic material.

U.S. Pat. No. 4,931,412 to Fischer et al. discloses a thin film solar cell with an n-i-p structure has roughened substrate surface.

U.S. Pat. No. 5,039,561 to Debe discloses a substrate bearing a microlayer which comprises uniformly oriented, crystalline, solid, organic microstructures.

U.S. Pat. No. 5,081,049 to Green et al. provides a method of processing a silicon solar cell substrate, by scribing the surface of the substrate to form a plurality of recesses and subsequently chemically etching the patterned surface to give a plurality of discreet upstanding structures of specifically desired shape.

U.S. Pat. No. 5,816,238 to Burns et al. discloses a solar collector exhibiting durable fluorescent properties comprising a polymeric matrix, dye, and hindered amine light stabilizer.

U.S. Pat. No. 6,224,016 discloses a flexible solar cell having a flexible substrate.

Despite these advances, the prior art fails to disclose optoelectronic devices, such as solar cells, light emitting devices, and photodetectors, comprising a plurality of fibers adhered to a light-emitting or light-receiving surface.

SUMMARY OF THE INVENTION

An optoelectronic device, such as a photovoltaic device (such as a solar cell), light-emitting device, photodetector, or photoresistor according to the invention comprises a substrate, having a substrate surface, a plurality of fibers supported by the substrate surface, a first layer, located so as to cover at least part of the substrate surface and at least part of the plurality of fibers, a second layer, located so as to cover at least part of the first layer, a first electrical contact in electrical communication with the first layer, and a second electrical contact in electrical communication with the substrate or first layer.

In a photovoltaic device, an electrical potential can be obtained between the pair of electrical contacts on exposure of the device to light. The first layer, second layer, and/or fibers may comprise a photovoltaic material providing a separation of electrical charges when illuminated. The first layer, second layer, and/or fibers may comprise a semiconductor material (such as an organic or inorganic semiconductor), a charge separation material, a polymer or polymer blend, a conducting polymer, a blend of a conducting polymer with a plurality of inorganic semiconductor particles, for example, a blend of poly(3-hexylthiophene) and cadmium selenide. The second layer, and/or substrate surface may comprise a conducting polymer, conducting metal oxide, metal film, or other conducting material, and may be transparent.

In a light emitting device, light emission can be obtained from the device on passage of an electrical current between the pair of electrical contacts. The first layer, second layer, or fibers may comprise a light emitting material, such as a light emitting polymer.

In addition, light emission or photovoltaic effects may be generated at interfaces within the device, for example between the first layer and the second layer, between the fiber and the substrate, between the fiber and the first layer, between fiber components of a multi-component fiber, or from some other interface. Fibers or layers may comprise internal semiconductor p-n junctions.

An optoelectronic device can comprise a substrate, a number of fibers supported by the substrate so that an end of each fiber is in electrical communication with the substrate surface; an insulating layer, covering the substrate, though which the fibers protrude, and a conducting layer, electrically isolated from the substrate surface by the insulating layer, wherein the conducting layer is in electrical communication with each fiber, and an electrically conducting path exists between the conducting layer and the substrate surface through each fiber. The substrate, in whole or in part (such as the substrate surface) may be electrically conducting. The insulating layer may be omitted. The electrically conducting path may comprise a semiconductor p-n junction, so that the optoelectronic device emits light, provides a photovoltaic potential, and/or is sensitive to light.

A light emitting device can be energized by an electric current passing through at least part of each fiber. For example, electrical contacts may be provided on the device, in electrical communication with the substrate and a conducting layer, through which an electrical current can be applied. Light may be emitted from a p-n junction on providing electrical communication between the conducting path through the fiber and a source of electrical energy. Electromagnetic radiation (such as laser radiation, microwaves, radio waves, UV, or IR), or other radiation such a nuclear radiation, sound waves, or ultrasound, may also be used to excite emission of light, for example through inducing current flow through a conducting path.

Alternatinng currents may be used to energize a light emitting layer or fiber even without direct (conductive) electrical commmunication, for example using capacitive or inductive coupling.

In other embodiments, such as a solar cell, an electrical potential may be provided between the substrate and conducting layer on exposure of the fibers to emit visible or invisible optical radiation.

An adhesive layer can be provided to hold the fibers on the substrate surface. The fibers can be randomly deposited on the substrate surface by a flocking method. The fibers can comprise a semiconductor material, metal, polymer, electroluminescent material, insulator, conductor, or other material or combination of materials. Fibers may comprise a semiconductor p-n junction, concentric layers of material, or other structure.

A p-n semiconductor junction can formed at the interface between the fibers and the substrate surface, within the fibers (for example by doping before or after a flocking procedure), or at the interface between the fibers and a conducting layer deposited over the fibers.

A photovoltaic device (such as a conventional silicon based solar cell) may comprise a substrate of semiconductor material (such as silicon) comprising a p-doped region and an n-doped region, a p-n semiconductor junction between the p-doped region and the n-doped region, and a surface, wherein an electrical potential is developed between the p-doped region and the n-doped region on illumination of the surface. The device can further comprise a pair electrical contacts, to the n-doped region and to the p-doped region respectively, so as to allow an electrical current to be obtained from the device on illumination of the device. An improved device further comprises a plurality of fibers disposed on the surface. For example, fibers transparent to solar radiation may be deposited by a flocking method on a light receiving surface of a solar cell. The fibers may comprise a polymer, glass, a fluorescent material, a light absorbing material, a UV absorbing material (for example, so as to reduce aging), or other advantageous component.

The fibers can be disposed on a surface of a semiconductor material using a flocking method, so that, for example, the fibers are randomly distributed and are disposed so that the long axes of the fibers are, on average, oriented substantially orthogonal to the semiconductor surface. If the surface is textured, fibers may be substantially parallel, or substantially orthogonal to the local surface orientation.

The surface of the semiconductor material may supports a protective film, which may be a transparent within the wavelength range at which the photovoltaic effect is obtained. The protective film may comprise an electrode, forming an electrical contact. The fibers may be disposed on the protective film. The surface may support a layer of adhesive to hold the fibers proximate to the surface.

A photothermal system comprises a tube having an outer surface and an aperture in which a fluid can be located (for example, stored in, contained, or passed through), a layer of adhesive on the outer surface of the tube, and a plurality of fibers disposed on the outer surface of the tube, held in place by the layer of adhesive. The fibers may be deposited on the surface using a flocking method. The tube may be rotated as fibers are deposited by flocking. A film may be coated with fibers using a flocking method, and the film wrapped around the tube. A light absorbing layer may also be provided on the outer surface of the tube. The fibers may contain a light absorbing material.

The tube may in part have a sinuous form, be supported on a rooftop, be coated with a transparent protective material, be covered with a protective sheet, such as a glass or polymethylmethacrylate sheet, and the like. The tube is mounted on any surface exposed to sunlight, and protected from mechanical damage by a protective sheet mounted above the tube (between the tube and the source of solar radiation).

Water, or other fluid, can be pumped through the aperture of the tube so as to be warmed by solar radiation. Pumping can be continuous, or intermittent. Water may circulate through the tube once, or more than once. Water may be sterilized by heating alone, or by heating combined with another treatment, such as chlorination, or UV exposure.

A light-emitting system according to the invention comprises a substrate having a substrate surface, a plurality of fibers supported held on the substrate surface by a layer of adhesive, and a source of energy, wherein the source of energy induces a light emission from the fibers. The source of energy may comprise electromagnetic radiation (such as a laser, radio waves, microwaves, IR, visible, UV, x-ray or gamma rays), an electric potential, an electric discharge, a plasma, capacitive or inductive coupling to an alternating current source, ultrasound, or other source of energy. The fibers may comprise an electroluminescent material, or other light-emitting material.

A method of fabricating a photovoltaic device comprises, providing an electrically conducting substrate (for example, the substrate may have a conducting surface), coating the substrate with an adhesive layer, and depositing a plurality of fibers on to the substrate, for example using a flocking method. Flocking methods include electrostatic flocking, pneumatic flocking, vibration flocking, gravity fed flocking, and a combination of all or some of these techniques. The fibers may extend away from the substrate, and can be held in place by an end of each fiber by the adhesive layer. In one embodiment, the fibers comprise a semiconductor material, and are treated so as to obtain a p-n semiconductor junction within the fibers. Electrical contacts are provided to the fibers, so that an electrical potential is obtained between the electrical contacts on exposure of the fibers to light. For example, a p-n semiconductor junction can be obtained within the fibers by diffusion of one or more dopants into the fibers (before and/or after deposition of the fibers onto the surface).

BRIEF DESCRIPTION OF THE DRAWINGS

FIG. 1 shows an optoelectronic device having a plurality of fibers;

FIGS. 2A and 2B shows a fiber having an internal p-n junction;

FIG. 3 illustrates a method of fabricating an improved optoelectronic device;

FIG. 8 shows an optoelectronic device;

FIGS. 10 and 11 show configurations having opposing substrates;

FIG. 12 illustrates a textured substrate;

FIG. 13 illustrates successive flocked layers;

FIG. 14 shows a device formed using a luminescent polymer; and

FIG. 15 shows an optoelectronic device.

DEFINITION

Figure 4:
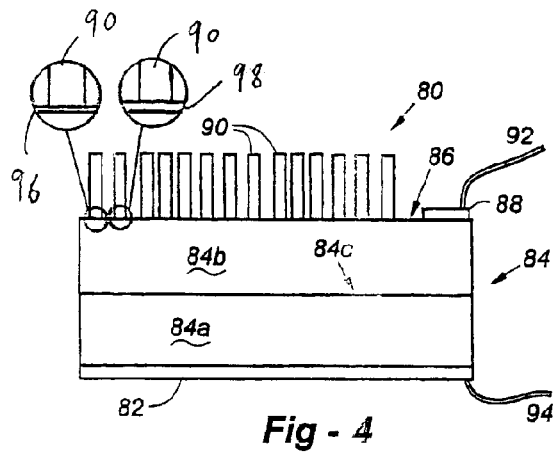
FIG. 4 shows a photovoltaic device having a plurality of optically transmissive fibers.

In this specification, the term fiber refers to rods, tubes, ellipsoids, whiskers, tendrils and similar elongated structures having a finite length and a cross-sectional dimension less than the length.

Flocking refers to the coating of at least part of a surface with a plurality of fibers. Various flocking techniques are known in the art, all of which apply fibers in a substantially random fashion.

A substrate acts a support for the fibers. Unless stated otherwise, the term "substrate surface" refers to a surface of the substrate on which fibers are deposited, in whole or in part.

The distal end of a fiber is the end protruding away from a surface. The proximate end of a fiber is the end in contact with, or most proximate to, the substrate surface.

A flock adhesive can be used to promote adherence of fibers to a surface. Flock adhesives may comprise silicone, acrylate, urethane, acrylonitrile and other adhesives known in the art, UV curable adhesives, and also other liquids and gels which may be used to hold fibers at the substrate surface.

An optoelectronic device may be a light-emitting device (such as a light emitting diode or laser), photovoltaic device (such as a solar cell), and the like, for example emitting or sensitive to IR, optical, or UV radiation, or a photodetector.

DETAILED DESCRIPTION OF THE INVENTION

FIG. 1 shows a cross-section of part of an optoelectronic device, shown generally at 10, comprising an electrically conducting substrate 12, an adhesive layer 14, insulating layer 16. fiber 18, an electrically conducting layer 20, a first electrical contact 24, and a second electrical contact 26.

The fibers can be deposited on the substrate by a flocking technique, so that adhesive layer 14 is a flock adhesive layer. Flocking techniques are well known in the art, as discussed in more detail later.

For example, the conducting layer 20 may comprise a p-type doped semiconductor, and the fibers may comprise a n-type doped semiconductor so as to form a p-n semiconductor junction at the interface 22 between the conducting layer and the fiber surfaces. As will be clear to those skilled in the art, the doping pattern can be reversed (i.e. the conducting layer may comprise an p-type doped semiconductor and the fibers comprise an n-type doped semiconductor). It can be advantageous, for photovoltaic applications, to provide a p-n junction near the surface of the device, and to provide a surface structure having a low reflectance.

Illumination of the device 10 by photons can induce an electrical potential between the conducting layer and the conducting substrate, due to the photoexcitation of current carriers which pass through the p-n junction. The electrical potential appears between electrical contacts 24 and 26.

In another embodiment, an improved light emitting diode is provided by passing an electric current through the device (between contacts 24 and 26) induces photon emission from the p-n junction. Barrier layers (for current carriers such as holes and electrons) can be provided at contact, electrode, layer surfaces, fiber surfaces, or at other surfaces, for advantages such as increased efficiency or longer device lifetimes.

The substrate surface may be patterned, so as to influence the spatial distribution of fibers on the surface. For example, the substrate surface may have a plurality of depressions (for example, having a cross-section similar to that of the fibers), trenches, protrusions, sinusoidal or other periodicity in one or more directions, and the like.

The electrically conducting substrate and/or conducting film may comprise a doped semiconductor, metal (such as gold, palladium, silver, or other metal film or multilayer), conducting oxide (such as tin oxide, indium tin oxide), conducting polymer, and the like. Preferably, either the conducting film or substrate is at least partly transparent within an appropriate wavelength range. Here, the appropriate wavelength range for a photovoltaic device is the range of wavelengths which excite an electrical potential, and for a light emitting device it is the range of wavelengths emitted due to electrical excitation. For an optically excited light emitting device, the substrate may be transparent to excitation light and the conducting layer transparent to emitted light, or vice versa. Alternatively, the conducting layer may cover only a fraction of the exposed fibers, so as to allow light to be emitted or received even if the conducting layer is opaque at the relevant wavelengths.

The substrate surface may have an antireflective coating, for example an absorbing dye, or one or more dielectric layers of thickness adapted to provide destructive interference of reflected light, such as a magnesium fluoride film.

The flock adhesive 14 may be electrically conducting or insulating. For example, the insulating layer may be formed from flock adhesive, through which the fibers protrude so as to make physical and electrical contact with the substrate surface. In this example, layers 14 and 16 are combined into a single insulating layer. Alternatively, the flock adhesive 14 may be insulating, and an additional insulating layer 16 provided, the fibers protruding through both layers so as to make electrical contact with the substrate. Alternatively, the flock adhesive 14 may be conducting to assist electrical contact between the fiber and the substrate. The adhesive may bead around fibers, be removed from exposed substrate surface areas, or otherwise be non-uniformly distributed.

Exposed flock adhesive may be removed after the flocking process is complete, for example to facilitate deposition of an insulating layer on the exposed substrate surface. In this case, the layer 14 can removed, e.g. by etching, mechanical methods, thermal methods, laser ablation, or the like, before deposition of the insulating layer 16.

After the flocking process is complete, but before the flock adhesive has hardened, the distal ends of the fibers may be subject to a physical force so as to promote electrical contact with the substrate through the flock adhesive. Flock adhesive may be curable, for example using UV radiation, heat, chemical interactions, the passage of time, or some combination of factors. Flock adhesive may be a contact adhesive. Flock adhesive may be a liquid film, which supports the fibers using capillary forces, before removal, conversion into a permanent layer, other layer provision, or other process.

Deposition of the insulating layer 16 may cause unwanted deposits on the fibers, particularly at the distal end. These deposits may be removed from the distal end of the fibers and from surrounding regions of the fibers, by methods such as dipping in etchant, flexing the fibers, mechanical abrasion, and the like, or substantially prevented from forming by a prior surface treatment of the fibers. Alternatively, the insulating layer deposits may allowed to remain.

The conducting layer 20 need not cover the entire surface of the fiber exposed above the insulating layer. For example, the conducting layer may only contact the side surface of the fibers adjacent to the insulating layer. Evaporated metal films may be used, such as silver, gold, palladium, copper, or other metal film. Screen printing can also be used to deposit conducting films, e.g. a silver conducting film. Evaporation may be at a normal or oblique incidence. Other methods of providing a conducting film or its equivalent are discussed in more detail below.

In other embodiments, the fibers and conducting layer may have the same doping, such as p-type, and the substrate comprises an oppositely doped (n-type) semiconductor, so that a p-n junction is formed at the interfaces between the fibers and the substrate.

In other embodiments, an optoelectronic device may be formed having a p-doped semiconductor-intrinsic layer-p-doped semiconductor (p-i-n) structure. For example, a doped semiconductor substrate may be coated with an intrinsic semiconductor layer, and doped fibers flocked thereon.

In other embodiments, a hole accepting organic material, such as a polymer, may be used in place of a p-typed doped semiconductor, and an electron accepting organic material may be used in place of an n-type doped semiconductor.

Semiconductors which may be used for substrates and/or fibers include inorganic semiconductors (such as arsenides (e.g. GaAs, (In,Ga)As, InAs), phosphides (e.g. GaP, InP, (In,Ga)P), arsenide phosphides, nitrides (e.g. GaN, (Ga,In)N, InN), tellurides (e.g. CdTe, ZnTe, (Hg,Cd)Te), selenides (e.g. ZnSe, $Cu_2Se$), sulfides (e.g. CdS, $Cu_2S$, ZnS), selenide sulfides, silicon, germanium, magnetic semiconductors, and the like, and organic semiconductors such as polymers or other organic materials. Other semiconductor materials are well known to those skilled in the art, for example as recited in U.S. Pat. No. 6,441,395 to Yu et al., the contents of which are incorporated herein by reference, and the given examples are not intended to be limiting. Fibers and substrate may be comprised of dissimilar semiconductor materials. Fibers may comprise a core of one material, with a surrounding region of a dissimilar material. For example, silicon fibers may be formed by grinding, cutting, etching, laser ablating, or otherwise processing silicon, or by crystal growth methods. Etching includes wet etching and dry etching methods, such as reactive ion etching and plasma etching. Other types of fibers may be formed by analogous methods.

Fibers may be small enough to generate quantum size effects. For example, silicon fibers may be used having a nanometer scale or micrometer scale size so as to increase luminescence in the visible region of the spectrum, an effect well known in the porous silicon art, for example.

In another embodiment, the fibers comprise an electroluminescent polymer which emits light on application of an electric potential between the contacts. The fibers may also comprise luminescent polymers which emit light on excitation with photons.

Electroluminescent polymers, other light emitting polymers, and conducting polymers include poly(p-phenylene vinylene) (PPV), polypyrroles, polyarylenes, anthracene containing polymers, flourene-containing polymers, co-polymers, other conjugated polymers, other polymers known in the art, derivatives, co-polymers, and blends.

In other embodiments, the conducting layer can be replaced by a network of fine conductors (such as fine metal wires, conducting polymer threads, or the like), which may be threaded or otherwise disposed between and/or around the fibers.

In other embodiments, the conducting layer can comprise a conducting fluid which fills the gaps between the fibers, and is in electrical communication with an electrode or other electrical contact. For example, an indium tin oxide electrode on a glass cover may be supported above the fibers, and the gap filled with a conducting fluid.

Flocking methods are well known in the art. For example, electrostatic flocking or electroflocking is used to coat a surface with fibers by providing an electrical charge on the surface, and an opposite electrical charge on the fibers. Pneumatic flocking uses an fluid jet to align fibers in the direction of fluid flow. Different flocking techniques can be used in combination, for example it is known to combine pneumatic flocking and electrostatic flocking techniques. Fibers may also be deposited on a surface using injection or insertion molding methods. Flocking methods and flock adhesives are described in U.S. Pat. No. 6,306,498, and U.S. Application Publication No. 2002/0019645, the contents of which are incorporated herein by reference.

FIG. 2A shows (in cross-section) a fiber shown generally at 40, having a structure comprising an n-doped semiconductor cylindrical core 42, a surrounding concentric p-doped semiconductor region 44, and an outer insulating shell 46. The fiber contacts a surface 50, having an indentation 48, and having electrical conductors 54 and 56 which contact the n and p doped regions respectively. The substrate surface 50 has indentations 48 which are similar in cross-section to that of the fibers. The distal end of the fiber can be coated with a protective layer, such as an insulating oxide.

Electrostatic flocking can be used to draw the fibers into the surface indentations. Flock adhesive may be restricted to the inside surfaces of the indentations, so that fibers not seated in an indentation are easily removable. Electrodes contacting the p-type and n-type regions (respectively) can be electrically interconnected. The indentation 48 may be a depression having a cross section similar to that of the fiber, or may be a trench, groove, or the like.

FIG. 2B shows a top view of a fiber 60, having an n-doped core 64 and p-doped surround 62, supported by a substrate surface 76 having electrodes 66 and 68 protruding from conducting tracks 70 and 72. An adjacent, similar fiber is shown at 74.

FIG. 3(A–D) illustrates a method of fabricating an improved optoelectronic device. FIG. 3A corresponds to the provision of an electrically conducting substrate 80 coated with a flock adhesive layer 82. The flock adhesive can be a liquid or gel through which fibers may pass, and which serves to hold the fibers in place, at least temporarily. FIG. 3B corresponds to the deposition of a plurality of semiconducting fibers, such as fiber 84, onto the surface of the substrate 80. Deposition can use conventional flocking methods, as are well known in the art. After fiber deposition, mechanical pressure or other techniques can then be used to obtain a better contact between the fibers an the surface. The flock adhesive can be curable, or otherwise processed or modified, for example to provide an insulating layer such as an oxide layer.

For example, the substrate surface may be spin-coated with a liquid silane, such as tetraethoxysilane (TEOS). This liquid layer can be used as a flock adhesive, to hold fibers on the substrate. Viscosity modifying additives can be used.

Semiconductor fibers can used, and be doped n-type or p-type. For non-limiting definiteness, in this example the fibers are assumed to be p-type doped silicon. A TEOS layer can be provided as a flock adhesive layer 82, and after fiber deposition (for example, as shown in FIG. 3C, showing fiber 84) be converted to a silicon dioxide layer, e.g. by heating. Other silicon dioxide, ormosil, or other insulating layer precursor may be used instead of TEOS.

The fibers can then doped with an n-type dopant, for example as shown in FIG. 3C) so that the n-type dopant diffuses into the surface of the fibers. A p-n junction is hence formed near the surface of the fibers, in this example between n-doped fiber regions such as 86 and remaining p-doped fiber regions 88. Electrical contact with the p-type cores of the fibers can be provided by the contact between the fibers and the conducting substrate. Electrical contact with the n-type outer regions of the fibers can be provided by evaporating a conducting film, shown at 90 in FIG. 3D. Other methods include contacting the distal ends of the fibers with a plane, transparent electrode, such as a flexible film having a conducting surface region, providing wires, capacitive or inductive coupling, or other methods.

FIG. 4 shows in cross-section a photovoltaic device shown generally at 80 comprising a first electrode 82, semiconductor slab 84, the slab having p-doped region 84a and n-doped region 84b so as to form a p-n junction 84c, the slab having a surface 86, electrode 88, plurality of fibers disposed on surface 86, such as fiber 90, and electrical connectors 92 and 94.

In this example, the fibers can be attached to the surface 86 by a flocking technique. The surface 86 may be coated, at least in part, with a flock adhesive layer 96 or protective layer 98 before the fibers are attached.

In certain embodiments of the device shown in FIG. 3, the fibers and flock adhesive are substantially transparent to radiation of interest. In the case of a silicon based photovoltaic device, radiation of interest comprises visible and IR wavelengths. The fibers may comprise optical fibers (such as glass fibers or polymer fibers), or other fibers transparent to wavelengths within the range of wavelengths that can induce a photovoltaic effect within a semiconductor material.

In other embodiments, the fibers can be doped with, be coated with, or otherwise support, fluorescent materials. These fluorescent materials may be advantageously used to generate a fluorescent wavelength to which a photovoltaic element (such as a semiconductor slab, or photovoltaic layer) is relatively sensitive to, using an excitation wavelength at which the photovoltaic element is less sensitive. For example, fluorescent dyes may be advantageously provided which produce red fluorescence from blue excitation radiation, as a conventional silicon photovoltaic device is more sensitive to red light than to blue light. The plurality of fibers may comprise solid rods, tubes, loops, curve structures, or other forms. U.S. Pat. No. 5,816,238 to Burns et al., the contents of which are incorporated herein by reference, discloses suitable fluorescent dyes, including thioxanthone, peryline imide, and/or thioindigoid compounds.

For example, an improved solar cell may comprise a conventional solar cell, onto which a flocked layer of polymer fibers are deposited. A conventional amorphous silicon solar cell can be fabricated by depositing an amorphous silicon layer onto a glass base, followed by in-diffusion of dopants. Regions of p-doping can be formed by introducing boron atoms, and regions of n-doping can be formed by introducing phosphorus. Doping is described in more detail in U.S. Pat. No. 4,322,571. A p-n junction is created, and electrodes connected to the front and back of the cell. An improvement comprises coating the front (light exposed) surface of the cell with an adhesive layer, then using conventional flocking methods to coat the front surface with fibers.

In a another embodiment, a photodetector, such as disclosed in U.S. Pat. Nos. 4,663,118 or 5,119,156, can comprise a flocked fiber layer on the light entry surface of the photodetector. An improved photodetector may be fabricated by depositing a plurality of fibers onto a light receiving surface by a flocking method. The fibers may comprise light absorbing chemicals (dyes) and structures, fluorescent materials, phosphors, or other spectrum shifting or spectrum modifying components so as to increase sensitivity or reject an unwanted wavelenght.

Figure 5:
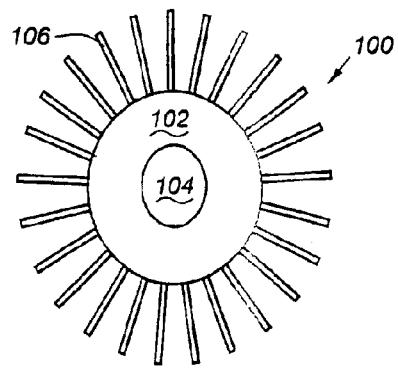
FIG. 5 shows a photothermal collector.

FIG. 5 shows a cross-section 100 of an improved solar collector, in the form of a fiber-coated pipe, for heating of a fluid such as water, comprising a tube 102, having an inside surface enclosing a passageway 104 through which a fluid may pass, and an outer surface having disposed thereon a plurality of fibers 106.

The fibers can be coated onto the outer surface of the tube by a flocking technique. The tube may be rotated during a flocking process to help obtain a more uniform coating or radial distribution of fibers. Alternatively, the fibers can be disposed only on parts of the outside surface of the tube which will be exposed to light. In other embodiments, the fibers may cover only a portion of the outer surface of the tube, and may be substantially parallel. The outer surface of the tube may be coated with a light absorbing surface, such as black paint. The flock adhesive may be light absorbing.

In an alternative embodiment, the outer surface of a tube is wrapped with a flexible coating having a plurality of fibers extending radially outwards. The flexible coating may be a black flocked fabric.

The fibers provide a number of advantages, such as improved solar energy absorption, reduced convection cooling. The fibers may comprise, for example, a plastic containing a light-absorbing chemical. The light absorbing chemical may be evenly distributed through the fiber, or may be concentrated near the flocked surface. The fibers may be solid rods, tubes, or another form.

Figure 6:
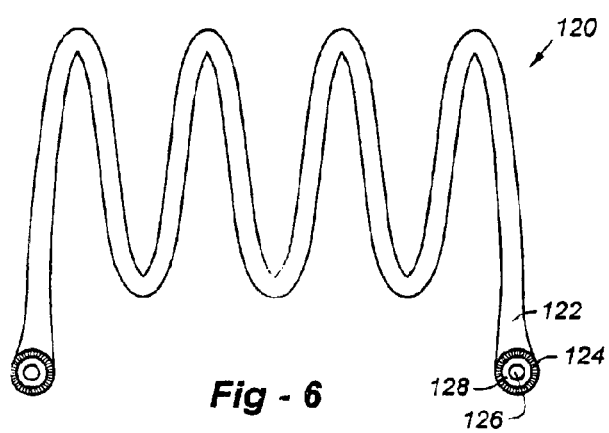
FIG. 6 shows a solar heating system for a fluid.

FIG. 6 shows an improved photothermal fluid heating system 120 comprising a fiber coated pipe 122 such as described above in relation to FIG. 5. A sinuous tube 128 has a central aperture 126, through which a fluid passes, or can be contained, and a plurality of radially extending fibers (124) coating the outside surface of the tube. For example, water may be continuously pumped through the system, which may be mounted on the roof of a house. A transparent protective layer, such as glass, may cover the fiber coated tube. The fluid heating system of FIG. 6 can also be advantageously used for water sterilization, by allowing contained water to achieve an elevated temperature before release from the system.

Figure 7:
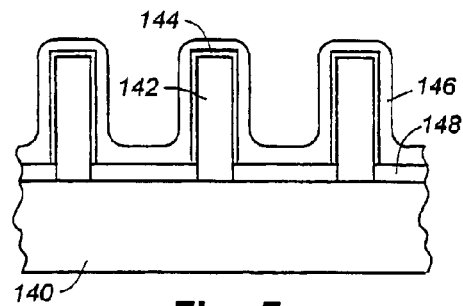
FIG. 7 shows an optoelectronic device.

FIG. 7 illustrates, in cross-section, an optoelectronic device comprising a substrate 140 coated with a plurality of electrically conducting fibers, such as fiber 142, an electroluminescent layer 144, a conducting layer 146, and a separating layer 148. The separating layer may be an adhesive layer, insulating layer, or a conducting layer, and in other embodiments may be omitted.

The conducting fibers may comprise graphite, metal, or other conducting material. The electroluminescent layer may comprise a polymer, transition metal complex, or other electroluminescent material. The conducting layer is preferably transparent at the luminescent wavelength, and may comprise a conducting oxide, such as indium tin oxide.

In other embodiments, an optoelectronic device can comprise a substrate surface supporting a plurality of fibers, a first layer covering at least part of the substrate surface and fiber surfaces, and a second layer covering at least part of the first layer. For example, the second layer can comprise a metal film, conducting oxide, or other material, and the first layer can comprise a light emitting material such as a light emitting polymer. An advantage of this device configuration is an increase radiant area. In another embodiment, the second layer comprises a photovoltaic material which provides an electrical potential on illumination by photons. An improved solar cell, having improved light absorption efficiency, may have this configuration. Electrical contacts may be provided to the first layer, second layer, or to an additional conducting layer which may be provided to cover or otherwise be in electrical communication with the second layer.

FIG. 8 shows a fiber 160 in cross-section comprising an electrically conducting core 162 surrounded by an electroluminescent layer 164 and an outer conducting film 166. The core is aligned with an electrode 174 by surface texture of the substrate 170, in this example in the form of a depression 168. The depression may take several forms, such as dish-shaped or the form of a trench. An insulating layer 172 is disposed on the substrate. The distal end of the fiber can also be coated with an insulating layer 174. A conducting layer 176 is provided, which forms an electrical contact with the conducting film 166. Provision of an electric current between the electrode 174 and the conducting layer 176 induces electroluminescence from the electroluminescent layer 164.

For example, the fiber core 162 may be metal or conducting polymer. The electroluminescent layer may be an electroluminescent polymer or monomer. The conducting film 166 may be a transparent electrode or a transparent conducting polymer, metal film, other conducting polymer, semiconductor, oxide film, or other material. In other embodiments, the fibers may comprise a photovoltaic material or structure.

Figure 9:
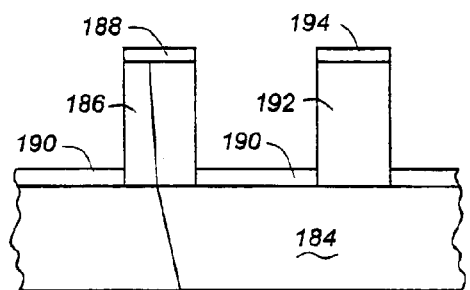
FIG. 9 illustrates a method of optically exciting fibers.

FIG. 9 shows a plurality of fibers supported on a surface, selectively illuminated by a laser. The system comprise a laser 180, a beam steerer 182, a substrate, substantially transparent to laser radiation, 184, a fiber 186, a fiber 188, and laser blocking (e.g. absorbing or reflecting) layers 190, 188, and 194. The beam steering device allows single fibers, or groups of fibers, to be selectively irradiated. Focusing lenses or other optical elements can be provided as advantageous.

For example, optical fibers can be doped with luminescent dyes, and flocked onto a substrate. For example, a single long fiber can be doped and then chopped into shorted segments for flocking. A scanned laser beam can be used to excite luminescence from the irradiated fibers for display applications. For example, the fibers and laser can be the same side of the substrate, and radiation emitted through the substrate, which acts as a screen. Alternatively, the laser can be on the opposite side of the substrate from the fiber array. The substrate should be transparent at the appropriate wavelengths. For example, fibers containing red, green, and blue emitting luminescent dyes can be distributed in predetermined patterns on a substrate, for example using sequential patterned deposition of a flock adhesive, each patterned adhesive deposition being followed by flocking of color emitting fibers.

In other embodiments, the fibers may be long enough so that conversion of laser excitation wavelengths to fluorescence wavelengths is substantially complete. The blocking layers 188 and 194 may be omitted. If a blue laser is used, red and green fluorescing fibers can be used, along with clear fibers (or non fiber-coated regions) for providing blue color to a display. Here, the term fluorescence includes phosphorescence. Beam steering devices are well known in the art, and need not be described in detail here. A beam steering device accepts an electrical signal and modifies the path of a beam in a manner correlated with the signal content, e.g. using photorefractive, mechanical, or other methods known in the art.

FIG. 10 shows an optoelectronic device, in cross-section, comprising first substrate 200, supporting a first plurality of fibers such as 202, in opposition to a second substrate 206, supporting a second plurality of fibers such as 204. The double headed arrow labeled d represents the gap thickness (d) between the two substrates. Subtrates may be sized and shaped appropriate for device configuration, such as a single light emitting lamp, display, photovoltaic roof covering, photodetector, or other application.

In one embodiment, fiber 202 comprises an electroluminescent layer coated onto a conducting core. For example, fiber 202 may comprise a metal core coated on the side surface of the fiber with an electroluminescent polymer, the metal core being in electrical contact with a lower electrode on the lower substrate. The terms upper and lower are used for convenience in relation to the Figure, and are not limiting. Fiber 204 is a conducting fiber, such as a metal fiber, in electrical contact with an upper electrode on the upper substrate. Application of an alternating voltage between the upper and lower electrodes induces electroluminescence from fiber 202, and similar fibers. All fibers on the lower substrate may comprise an electroluminescent layer, and all fibers on the upper substrate may be conducting fibers.

In other embodiments, there is a mixture of fiber types on upper and lower substrates. Regions of electroluminescent fibers, which may be of a chosen color emission, may be selectively energized using electrical conductors on top and bottom substrates. For example, transparent electrode stripes, such as indium tin oxide, may be provided on upper and/or lower substrates. Transparent electrodes may be provided on one substrate, and non-transparent electrodes provided on the other. The gap thickness d can be set at greater than the conducting fiber lengths, for example using spacer elements, or including non-conducting fibers of slightly greater length into the mixture of flocked fibers. Fibers may be energized by alternating electrical fields even without a direct conductive path. In photovoltaic device embodiments, at least some fibers comprise a photovoltaic material.

In one embodiment, the fibers comprise an electroluminescent material, which emits light if an electric potential is applied to the fibers. Areas of fiber-coated substrate can be selectively energized, for example by using a stripe pattern of conductors on top and/or bottom substrates, for example crossed stripe patterns of conducting, transparent electrode materials such as indium tin oxide.

FIG. 11 shows a lower substrate 220 supporting fibers 222. The distal end of the fibers can be made to contact the upper substrate 224 by reducing the gap thickness, d, for example by mechanically forcing the substrates together.

In another embodiment, one substrate supports n-doped semiconductor fibers, the other substrate supports p-doped semiconductor fibers. Semiconductor p-n junctions are formed where fibers supported by opposing substrates are in contact. Lateral motion of substrates may be provided to facilitate contact between. In this embodiment, the gap thickness can be greater than the fiber length.

The gap between opposing substrates may be evacuated, filled with inert gas such as a rare gas or nitrogen, or filled with a transparent insulator.

FIG. 12 shows a number of fibers 246 flocked onto a textured surface 248 of substrate 240. A flock adhesive layer 242 holds the fibers in place. A conducting film 244 provides electrical contact with the fiber edges.

In one embodiment, the fibers comprise p-doped silicon, and the substrate comprises n-doped silicon. A p-n semiconductor junction is formed at the interface between the fibers and the substrate surface. (As stated elsewhere, in relation to all examples, the p-doped regions and n-doped regions can be reversed.)

In another embodiment, the fibers and substrate are initially p-doped silicon, then the exposed areas of fibers are exposed to n-dopant diffusion (for example, by exposure to a gaseous phosphorus compound such as phosphine) so as to form a p-n junction near the exposed surface of the fibers. This n-doping may occur after flocking but before deposition of the conducting film.

In a further embodiment, the substrate 240 comprises a silicon film having a p-n junction, and the fibers are transparent in part of the IR-visible light spectrum so as to guide light to the surface of the silicon film. In this case, the conducting film may be transparent. A conducting flock adhesive may be advantageously used.

FIG. 13 shows a conducting substrate 260, having a number of flocked fibers 264 held in place by a flock adhesive layer 262. A second layer of flocked fibers, such as 266, are then deposited. An adhesive (not shown) may be used to hold the second fiber layer in place. A conducting film 268, such as a metal film, metal coated flexible film, or other conductor, is then used to make electrical contact with the second layer. For example, the first layer of fibers 264 may be p-doped semiconductor, and the second layer 266 may be an n-doped semiconductor, so as to create a p-n junction at the contact between the two fiber layers. In other embodiments, additional layers may be deposited, for example so as to obtain higher potential photovoltaic devices. Devices may comprise uniformly layered, non-uniform, or dendritic fiber structures.

FIG. 14 shows, in cross-section, an electrically conducting substrate 280, supporting a plurality of electrically conducting fibers 284 held in place by a flock adhesive layer 282. The fibers, which may comprise a conducting core, such as metal, are coated with an electroluminescent coating 288. The coating 288 can be deposited after the fibers are disposed on the substrate, for example by vapor deposition, dipping into a solution, evaporation, sputtering, sublimation, or other deposition method, or the coating may be formed before deposition of the fibers. The coating may comprise a polymer such as P3HT (poly(3-hexylthiophene)), or a blend of P3HT and CdSe, wherein CdSe (cadmium selenide) particles or nanorods are dispersed through the P3HT layer. Such a blend is known in the art. A conducting film 286 is formed so as to contact the outside of the electroluminescent coating, so than an electric potential applied between film 286 and substrate 280 can excite light emission from the coating. Separating layer 282 can be an insulating layer, flock adhesive layer, conductive layer, light emitting layer, photovoltaic layer, or can be omitted.

Light emission can obtained from electroluminescent materials (such as polymers, metal complexes, and organic molecules) by providing suitable anode and cathode materials, as are known in the art. For example, as disclosed in U.S. Pat. No. 6,461,885 to Lupo et al., anode materials include indium tin oxide, polyaniline, fluorine-doped tin oxide, and gold, whereas cathode materials may comprise magnesium, aluminum, lithium, barium, calcium, or combinations thereof. Other anode and cathode materials are known in the art, the anode material having a higher work function than the chosen cathode material. Further, charge carrier transport layers, charge carrier blocking layers, and protective layers (such as to prevent oxidation) can be provided. For example, the conducting film 286 may be coated with an oxidation prevention layer, such as a glassy material, oxide layer, or other material.

Either the substrate 280 or the conducting film 286 can be the cathode for the electroluminescent coating, depending on the choice of materials chosen for the substrate (or conducting substrate surface), the conducting core of the fibers, and the conducting film 286. The conducting core of the fibers may also act as a cathode or anode, depending on materials selected. For example, the conducting core may be silver, and the conducting film may be ITO. Other combinations are possible, as will be clear to those skilled in the art.

The conducting film 286 is in electrical communication with the fibers, and at least in part fills the spaces between the fibers. The conducting film can be provided by any deposition process, such as vapor deposition, vacuum deposition, sputtering, evaporation, solution coating, sublimation, and the like, or by other methods. (These deposition methods can be used for other film deposition in other embodiments). For example, a liquid (which may be a suspension, emulsion, or colloid) can be applied to the fiber coated surface, which under gravity and/or capillary forces migrates between the fibers. The liquid then dries or otherwise solidifies, in ambient conditions, or under heating and/or irradiation, to provide the conducting film. Suitable liquids are known in the art, for example liquid metals having a suitable melting point (not so high as to damage the fibers, and not so low as to destabilize the device), also as described in U.S. Pat. Nos. 6,277,740 and 6,406,984, the contents of which are incorporated herein by reference. Gaseous, liquid or solid components can be used to form conducting contacts with the fibers, for example as described in U.S. Pat. No. 6,406,984. Electric contacts (and other films such as conducting or insulating layers) may be formed by evaporation, other vapor deposition processes including plasma deposition, laser ablation deposition, vacuum deposition, and the like, or deposition of chemical precursors (e.g. of conducting polymers such as polyaniline or polyphenylenevinylene, the precursors of which may be polymerized or otherwise processed after deposition).

FIG. 15 illustrates an optoelectronic device comprising a substrate having a conducting substrate surface 302, an adhesive layer 304 covering at least part of the substrate surface 302, a plurality of fibers such as fiber 306, a first layer 308, a second layer 310, a first electrical contact 312 in electrical communication with the first layer 308, and a second electrical contact 314 in electrical communication with the first layer 310. The first and second layers can be electrically conducting.

In an improved solar cell embodiment having the structure of FIG. 15, either the first or second layers comprises a blend of an organic semiconductor with particles (such as nanoparticles or nanorods) of an inorganic semiconductor, for example a blend of electron acceptor particles in a hole acceptor polymer film. Specific examples are described below.

In an improved solar cell having the structure of FIG. 15, the first layer comprises a photovoltaic material (such as a blend of P3HT and cadmium selenide nanorods), the second layer comprises a conducting material (such as PEDOT:PSS, (polyethylene dioxythiophene doped with polystyrene sulphonate or equivalently polystyrene sulfonic acid, a transparent conducting film, the conducting substrate surface comprises a metal film (such as an aluminum or copper film) or conducting oxide film. Blends of P3HT and cadmium selenide nanorods which may be used in embodiments of the present invention are described by Alivisatos and co-workers in Science, vol. 295, pp. 2425–7 (29 Mar. 2002).

In another embodiment of a solar cell having the structure of FIG. 15, the conducting substrate surface comprises indium tin oxide, the first layer comprises PEDOT:PSS, the second layer comprises a CdSe/P3HT blend, and an aluminum electrode may be deposited over at least part of the second layer.

A further embodiment comprises a substrate, a plurality of fibers disposed on the substrrate, a first layer disposed on at least part of the substrate surface and fiber surfaces, comprising a light emitting material such as poly (p-phenylenevinylene) or other light emitting polymer, and a second layer, disposed on at least part of the first layer, comprising a conducting material for example, a conducting polymer, a metal film, conducting oxide film, a hole transport layer, PEDOT:PSS, or other conducting material. Alternatively, the second layer may comprise PPV or other light emitting polymer or light emitting material, the first layer may be a hole transport layer or other conducting film, and an additional third conducting layer provided covering at least part of the second layer. Electrical contacts, including patterned conducting structures on the substrate, or patterned conducting layers, can be provided as known in the art, for example as described in U.S. Pat. No. 6,462,469 to Young, the contents of which are incorporated herein by reference.

In other embodiments, fibers may comprise PPV or other light emitting polymer, the first layer may comprise PEDOT:PSS or other conducting film, and the second layer may be omitted, or comprise a conducting electrode material.

Other Embodiments

In other embodiments, a plurality of fibers, oriented with respect to a surface, can be used to align a liquid crystal layer. The aligned liquid crystal film can be used as an electro-optical shutter to modulate light emission from the fiber, or other light source. Appropriate combinations of electric field directions, fluid flow direction (with respect to pneumatic flocking) and surface microrelief can be used to provide an oblique alignment of fibers on the surface, which can provide high pretilt or bistable alignment of the liquid crystal layer.

In general, with reference to above described embodiments, a conducting substrate surface may comprise a metal (such as aluminum, copper, gold, silver, or some alloy or multilayer), a semiconductor, a doped semiconductor, a conducting polymer, or other conductor. The fibers may comprise a metal, conducting polymer, doped semiconductor, or other conductor. The first layer may comprise a conducting polymer (such as poly(p-phenylene vinylene) or derivative thereof), a hole accepting polymer (such as poly(3-hexylthiophene, P3HT), a blend of cadmium selenide particles and P3HT), or other material.

Flocked surfaces can also be used to create membrane electrodes, for example, for use in fuel cells. In this case, the fibers may comprise metal coated perylene red, for example as disclosed in U.S. Pat. No. 6,425,993, the contents of which are incorporated herein by reference. Fabrication of conducting coated fibers, and other shapes, is disclosed by U.S. Pat. No. 6,395,149 to Palmgren, the contents of which are incorporated herein by reference.

Flocked conducting fibers can be used to provide an improved electron emitter. For example, conducting fibers (such as fullerene tubes, graphite fibers, metal fibers, and the like) can be flocked onto a conducting surface (such as a metal, conducting polymer, doped semiconductor, and the like).

Fibers may comprise glass, polymers (such as rayon, nylon, polyesters, acrylates, terephthalates, polypropylene, polyethylene, semiconducting polymers), metal, metal oxide, non metals (such as silicon), oxides of non-metals, carbides, and nitrides. Fibers may be: conducting, semiconducting, or insulating; metallic, non-metallic, or semi-metal; formed from a single compound or a mixture of compounds; crystalline, glassy, liquid crystalline, or amorphous; uniform composition, graded composition, or comprise multilayer structures such as concentric regions.

Fibers may be conventionally sized in relation to conventional fabric use, for example having a length of approximately 0.76 mm, or may have a length in the range 0.1–10 mm, for example 0.2–5 mm, for example 0.2–3 mm. However, fibers may be shorter or longer than this. For example, longer fluorophor-doped fibers may increase the fluorescence intensity produced. Fibers may be coated with a protective film before or after flocking. A bulk sample of polymer may be doped with a fluorescent material before being drawn into long fibers, which may then be subsequently chopped into shorter length fibers. Alternatively, fibers of the final desired length can be vat dyed, or other additive added to the fiber. Fibers may be created by chopping a much longer length into the length desired, growth in micelles, or any other appropriate techniques. Fiber cross sections can be circular, oval, elliptical, square, polygonal, hollow, contain multiple apertures, or be of some other form.

Substrate surfaces may be plane, concave, convex, undulating, or otherwise structured. For example, a concave or convex substrate surface may be advantageous for photovoltaic devices. An improved optoelectronic device, such as a light emitting device, may comprise a source of excitation radiation surrounded, at least in part, by a substrate having a convex surface coated with a plurality of fibers, the fibers containing a fluorescent material. The fibers may be radially disposed in relation to the excitation source, and either the same side of the substrate as the excitation source or an opposite side.

Solar cell embodiments may be illuminated from the fiber side of the substrate surface. If the substrate is transparent, illumination may be from the opposite side of the substrate as the fibers.

Substrates may be rigid or flexible, and may comprise a woven fabric. For example, embodiments of the present invention include wearable photovoltaic cells, for example for powering a personal computer, and wearable highly fluorescent fabrics.

Substrates may include light absorbing, fluorescent, or reflective layers. For example, a fluorescent fabric may comprise fluorescent dye doped fibers flocked onto a flexible substrate having a reflective layer serving to reflect back incident light and/or fluorescence.

Examples have been described in relation to flocking methods. However, other techniques can be used to cover a surface with fiber equivalents, such as cutting loops, creation of surface textures (such as protrusions, ridges, holes, and the like), and other surface modifications. Methods which may be used include etching (including wet etching and dry etching methods), scribing, laser ablation, vapor deposition, methods adapted from scanning microscopy, manual placement, crystal growth techniques, localized heating, localized fiber pulling, stamping, and the like.

Devices have been described having p-doped and n-doped semiconductor regions. As will be clear to those skilled in the art, it may be possible to reverse the doping pattern (i.e. replace n-doped regions with p-doped regions, and vice-versa). Electric potentials, current flows, and the like may also be reversed. Semiconductor p-n junctions may be formed between p-doped and n-doped regions of the same chemical composition, or may be semiconductor heterojunctions. In other embodiments, a junction between a hole accepting compound and an electron-accepting compound can be provided instead of, or in addition to, a p-n junction, for example a junction between cadmium selenide and poly(3-hexylthiophene).

Light emitting devices fabricated according to the present invention may further comprise drive electronics, segmented, pixilated or otherwise patterned electrodes and/or light emitting layers, protective layers, reflective films, lenses, polarizers, optical filters, other optical components, power supplies, data communication interfaces, hole blocking layers or electron blocking layers proximate to light emitting materials, thin film transistor driving mechanisms, or other display or light emitting device components known in the art.

Solar cells fabricated according to the present invention may further comprise charge storage devices (such as batteries or capacitors), lenses or mirrors to direct sunlight onto operable regions of the device, UV filters for reduction of degradation, and the like.

Fibers may be excited by various methods, or combination of methods, to produce light emission. For example, the fibers may be illuminated with electromagnetic radiation (such as UV, visible, IR, microwave, radio waves, or x-ray radiation), which also includes ambient light, sunlight, lasers, and the like. Fibers may contain phosphors, for example to prolong light emission time after excitation. The phosphors may provide a prolonged light emission after excitation has ceased, or may provide excitation radiation after external excitation has ceased.

An organic electroluminescent devices may comprise an anode, a hole transporting layer deposited on the anode, an electron transporting layer, and a cathode, wherein the hole transporting layer or electron transporting layer may comprise a light emitting material. Conventionally, co-planar films are used. In embodiments of the present invention, light emitting materials may be used to form fibers, with other necessary layers deposited on the fibers or on the substrate supporting the fibers. Light emitting materials may also be used to form layers supported by flocked fibers, so as to increase light emission area. Another device configuration comprises a multilayer having an anode, a hole transporting layer, a light emitting material, and a cathode. In embodiments of the present invention, fibers or layers deposited thereon may comprise the light emitting material.

Fibers may be excited to electrical potentials, direct or alternating, for example through electrical contacts, proximity to electrodes (e.g. through capacitive coupling, inductive coupling), electronic discharges, static fields, and the like. Fibers may also be excited by ultrasound, triboluminescent effects, or other mechanical energy input, radioactivity, or heat.

Elements of each described embodiment, and other configurations, may be combined in other ways as will be clear to those skilled in the art. Examples given are not intended to be limiting. Other embodiments will be clear to those skilled in the arts.

Having disclosed my invention, I claim:

1. An optoelectronic device, comprising:
   a substrate, having a substrate surface;
   a plurality of fibers supported by the substrate surface;
   a first layer, located so as to cover at least part of the substrate surface and at least part of the plurality of fibers;
   a second layer, located so as to cover at least part of the first layer, and
   a pair of electrical contacts, comprising a first electrical contact in electrical communication with the first layer and a second electrical contact in electrical communication with the second layer,
   wherein the second layer is electrically conducting, and the first is electrically responsive to light or emits light on electrical energization.

2. The device of claim 1, wherein the device is a photovoltaic device, wherein an electrical potential is obtained between the pair of electrical contacts on exposure of the device to light.

3. The device of claim 2, wherein the first layer comprises a semiconductor material.

4. The device of claim 2, wherein the first layer comprises a photovoltaic material, wherein a photovoltaic material provides a separation of electrical charges when illuminated.

5. The device of claim 4, wherein the first layer comprises a blend of a conducting polymer with a plurality of inorganic particles.

6. The device of claim 5, wherein the conducting polymer comprises poly(3-hexylthiophene) and the inorganic particles comprise an inorganic semiconductor.

7. The device of claim 2, wherein the first layer comprises a blend of a conjugated polymer and a plurality of inorganic semiconductor particles, and the second layer is a transparent electrically conducting layer comprising a conducting polymer.

8. The device of claim 1, wherein the device is a light emitting device, wherein light emission is obtained from the device on passage of an electrical current between the pair of electrical contacts.

9. The device of claim 8, wherein the first layer comprises a light emitting material.

10. The device of claim 8, wherein the first layer comprises a light emitting polymer.

11. The device of claim 8, wherein light emission is generated at the interface of the first layer and the second layer.

12. An optoelectronic device, comprising:
- a substrate, having a substrate surface, wherein the substrate surface is electrically conducting;
- a plurality of fibers, supported by the substrate so that an end of each fiber is in electrical communication with the substrate surface;
- a conducting layer, being electrically conducting, covering at least part of the substrate surface and at least part of the plurality of fibers; and
- a pair of electrical contacts, comprising a first electrical contact in electrical communication with the conducting substrate and a second electrical contact in electrical communication with the conducting layer,
- wherein the device operates in a first mode or second mode, wherein the first mode corresponds to a generation of an electrical potential between the pair of electrical contacts on exposure of the device to light, and the second mode corresponds to light emission from the device on passage of an electrical current between the pair of electrical contacts.

13. The device of claim 12, further comprising an insulating layer disposed between the substrate surface and the conducting layer, providing electrical insulation between the conducting layer and the substrate surface, the fibers protruding through the insulating layer.

14. The device of claim 12, wherein an electrical path between the pair of electrical contacts comprises at least one semiconductor p-n junction.

15. The device of claim 12, wherein the fibers comprise a semiconductor material.

16. The device of claim 12, wherein the fibers and the substrate each comprise a semiconductor, and wherein p-n semiconductor junction is formed at the interface between each fiber and the substrate surface.

17. The device of claim 12, further comprising a transparent electrode layer, covering the second layer, and providing electrical communication between the second electrical contact and the second layer.

18. The device of claim 12, further comprising an adhesive adapted to hold the fibers on the substrate surface, and wherein the fiber are randomly deposited on the substrate surface by a flocking method.

19. The device of claim 12, wherein the device operates so as to generate an electrical potential between the pair of electrical contacts on exposure of the device to light.

20. The device of claim 19, wherein the fibers or the conducting layer comprises a photovoltaic material.

21. The device of claim 20, wherein the photovoltaic material comprises a blend of inorganic semiconductor particles and a conjugated polymer.

22. The device of claim 12, wherein the device operates so as to emit light on passage of an electrical current between the pair of electrical contacts.

23. A method of fabricating a photovoltaic device, the method comprising:
- providing a substrate;
- coating the substrate with an adhesive layer;
- depositing a plurality of fibers on to the substrate, wherein the fibers extend away from the substrate and are held in place by one end of each fiber by the adhesive layer, and wherein the fibers comprise a semiconductor material;
- treating the fibers so as to obtain a p-n semiconductor junction within the fibers; and
- providing electrical contacts to the fibers, so that an electrical potential is obtained between the electrical contacts on exposure of the fibers to light.

24. The method of claim 23, wherein the step of treating the fibers so as to obtain a p-n semiconductor junction within the fibers comprises the diffusion of a dopant into the fibers.

* * * * *